United States Patent
Manahan et al.

(10) Patent No.: US 9,250,023 B2
(45) Date of Patent: Feb. 2, 2016

(54) EXPLOSION-PROOF ENCLOSURES WITH ACTIVE THERMAL MANAGEMENT BY HEAT EXCHANGE

(75) Inventors: Joseph Michael Manahan, Manlius, NY (US); Marc Raymond Kozlowski, Cicero, NY (US)

(73) Assignee: Cooper Technologies Company, Houston, TX (US)

( * ) Notice: Subject to any disclaimer, the term of this patent is extended or adjusted under 35 U.S.C. 154(b) by 677 days.

(21) Appl. No.: 13/603,208

(22) Filed: Sep. 4, 2012

(65) Prior Publication Data
US 2012/0325429 A1    Dec. 27, 2012

Related U.S. Application Data

(62) Division of application No. 12/466,249, filed on May 14, 2009, now abandoned.

(51) Int. Cl.
| | |
|---|---|
| *F28D 15/00* | (2006.01) |
| *H02K 5/136* | (2006.01) |
| *H05K 7/20* | (2006.01) |
| *F28D 21/00* | (2006.01) |

(52) U.S. Cl.
CPC ................ *F28D 15/00* (2013.01); *H02K 5/136* (2013.01); *H05K 7/202* (2013.01); *F28D 2021/0029* (2013.01); *F28D 2021/0077* (2013.01)

(58) Field of Classification Search
CPC ............ F28D 15/00; F28D 2021/0029; F28D 2021/0077; H02K 5/136; H02K 7/202
USPC .................................................. 165/200, 201
See application file for complete search history.

(56) References Cited

U.S. PATENT DOCUMENTS

| | | | |
|---|---|---|---|
| 1,838,505 A | | 12/1931 | Shurtleff |
| 2,021,454 A | * | 11/1935 | Levin ..................... H02K 5/136 361/23 |
| 2,265,317 A | | 12/1941 | Schlirf |
| 2,395,298 A | | 2/1946 | Shock, Jr. |
| 2,789,238 A | | 4/1957 | Staak |
| 2,801,732 A | | 8/1957 | Gaubert |
| 2,801,768 A | | 8/1957 | Immel |
| 2,973,832 A | | 3/1961 | Cook et al. |
| 3,001,606 A | | 9/1961 | Bierwirth et al. |
| 3,810,732 A | | 5/1974 | Koch |
| 3,841,520 A | | 10/1974 | Bryant et al. |
| 4,274,262 A | | 6/1981 | Reed et al. |
| 4,297,850 A | | 11/1981 | Reed |
| 4,484,690 A | | 11/1984 | Nash |
| 4,510,874 A | | 4/1985 | Hasenack |

(Continued)

FOREIGN PATENT DOCUMENTS

JP    02233908    9/1990

OTHER PUBLICATIONS

National Electrical Manufacturers Association, NEMA Enclosure Types, NEMA Standards Publication 250-2003 Enclosures for Electrical Equipment (1000 Volts Maximum), Nov. 2005, 9 pages.

*Primary Examiner* — Ljiljana Ciric
(74) *Attorney, Agent, or Firm* — King & Spalding LLP

(57) ABSTRACT

An explosion-proof enclosure including at least one heat exchanger for active thermal management. Equipment within the enclosure produces heat within the enclosure, while the at least one heat exchanger removes heat produced from the equipment and manages the internal temperature of the enclosure to a level suitable for hazardous locations.

9 Claims, 2 Drawing Sheets

(56) References Cited

U.S. PATENT DOCUMENTS

| | | |
|---|---|---|
| 4,543,114 A | 9/1985 | Beattie et al. |
| 4,797,254 A | 1/1989 | Seidel |
| 4,823,554 A | 4/1989 | Trachtenberg et al. |
| 4,984,302 A | 1/1991 | Lincoln |
| 5,027,781 A | 7/1991 | Lewis |
| 5,082,478 A | 1/1992 | Oono et al. |
| 5,094,236 A | 3/1992 | Tayebi |
| 5,139,673 A | 8/1992 | Martin |
| 5,191,990 A | 3/1993 | Fritts |
| 5,243,632 A | 9/1993 | Badin et al. |
| 5,269,146 A | 12/1993 | Kerner |
| 5,358,443 A | 10/1994 | Mitchell et al. |
| 5,456,164 A | 10/1995 | Bang |
| 5,496,389 A | 3/1996 | Wilcox |
| 5,505,046 A | 4/1996 | Nelson et al. |
| 5,524,440 A | 6/1996 | Nishioka et al. |
| 5,588,300 A | 12/1996 | Larsson et al. |
| 5,603,220 A | 2/1997 | Seaman |
| 5,609,032 A | 3/1997 | Bielinski |
| 5,661,978 A | 9/1997 | Holmes et al. |
| 5,718,124 A | 2/1998 | Senecal |
| 5,871,859 A | 2/1999 | Parise |
| 5,934,079 A | 8/1999 | Han et al. |
| 5,954,127 A | 9/1999 | Chrysler et al. |
| 6,003,319 A | 12/1999 | Gilley et al. |
| 6,021,642 A | 2/2000 | Guinn |
| 6,038,865 A | 3/2000 | Watanabe et al. |
| 6,170,267 B1 | 1/2001 | Kitaoka |
| 6,293,107 B1 | 9/2001 | Kitagawa et al. |
| 6,294,721 B1 | 9/2001 | Oravetz et al. |
| 6,301,910 B1 | 10/2001 | Noritake et al. |
| 6,308,519 B1 | 10/2001 | Bielinski |
| 6,372,983 B1 * | 4/2002 | Knaggs ............... H01M 2/10 174/17 LF |
| 6,384,380 B1 | 5/2002 | Faries, Jr. et al. |
| 6,401,462 B1 | 6/2002 | Bielinski |
| 6,409,920 B1 | 6/2002 | Lee |
| 6,469,303 B1 | 10/2002 | Sun et al. |
| 6,481,213 B2 | 11/2002 | Carr et al. |
| 6,494,189 B1 | 12/2002 | Chu et al. |
| 6,533,031 B1 | 3/2003 | Garcia et al. |
| 6,574,967 B1 | 6/2003 | Park et al. |
| 6,599,341 B2 | 7/2003 | Goyetche |
| 6,707,195 B1 * | 3/2004 | De Martino ........... H02K 5/136 310/88 |
| 6,823,831 B2 | 11/2004 | Chu et al. |
| 6,834,715 B2 | 12/2004 | Garcia et al. |
| 6,953,491 B2 | 10/2005 | Goyetche |
| 7,061,208 B2 | 6/2006 | Nishihata et al. |
| 7,384,704 B2 | 6/2008 | Scott |
| 7,625,415 B2 | 12/2009 | Durocher et al. |
| 7,764,497 B2 | 7/2010 | Becklin |
| 8,310,831 B2 | 11/2012 | Pal |
| 8,313,038 B2 | 11/2012 | Therrien et al. |
| 8,331,086 B1 | 12/2012 | Meissner |
| 8,347,781 B2 | 1/2013 | Stack |
| 8,349,481 B2 | 1/2013 | Nakamura |
| 8,353,167 B2 | 1/2013 | McGann |
| 8,424,316 B2 | 4/2013 | Tuszkiewicz et al. |
| 8,429,920 B2 | 4/2013 | Duval |
| 8,438,862 B2 | 5/2013 | Oman et al. |
| 8,459,497 B2 | 6/2013 | Milan et al. |
| 8,468,836 B2 | 6/2013 | Tuszkiewicz et al. |
| 8,490,413 B2 | 7/2013 | Blackway et al. |
| 2002/0152969 A1 | 10/2002 | Grigsby et al. |
| 2004/0008483 A1 | 1/2004 | Cheon |
| 2004/0103625 A1 | 6/2004 | Nakano et al. |
| 2005/0013753 A1 * | 1/2005 | Eaton ................... B01J 19/0013 422/198 |
| 2005/0029881 A1 * | 2/2005 | Preston ................ H02K 5/136 310/88 |
| 2006/0155073 A1 | 7/2006 | Oobayashi et al. |
| 2006/0254227 A1 | 11/2006 | Scagliarini |
| 2007/0119452 A1 | 5/2007 | Schubert |
| 2007/0285889 A1 | 12/2007 | Watson et al. |
| 2009/0317259 A1 * | 12/2009 | Burch, Jr. .............. F04B 49/025 417/1 |
| 2010/0022735 A1 | 1/2010 | Kanamori |
| 2010/0202103 A1 * | 8/2010 | Schwarz ................ H05K 5/063 361/679.01 |
| 2011/0120067 A1 | 5/2011 | Kim |
| 2013/0137358 A1 * | 5/2013 | Manahan ................ F24F 13/20 454/184 |
| 2015/0145355 A1 * | 5/2015 | Kincaid ................. H02K 5/136 310/54 |

* cited by examiner

EXPLOSION-PROOF ENCLOSURES WITH ACTIVE THERMAL MANAGEMENT BY HEAT EXCHANGE

CROSS-REFERENCE TO RELATED APPLICATIONS

This application is a divisional application of and claims the benefit of U.S. patent application Ser. No. 12/466,249, titled "Explosion-Proof Enclosures with Active Thermal Management By Heat Exchange" and filed on May 14, 2009, now abandoned in the name of Joseph Michael Manahan et al, the entire disclosure of which is hereby fully incorporated herein by reference. This application also is related to U.S. patent application Ser. No. 12/435,807, titled "Explosion-Proof Enclosures with Active Thermal Management Using Sintered Elements" and filed on May 5, 2009, in the name of Joseph Michael Manahan et al, the entire disclosure of which is hereby fully incorporated herein by reference.

TECHNICAL FIELD

The invention relates generally to explosion-proof enclosures, and, more particularly, to explosion-proof enclosures having active thermal management capabilities using heat exchange.

BACKGROUND

Automation equipment can be used to preserve the life of devices such as motors and pumps by improving device performance. However, the installation of automation equipment in hazardous or explosive environments typically has been avoided due to the high heat generated by components of the automation equipment, which could result in an explosion. Hazardous area requirements dictate that such equipment must be sealed from the surrounding atmosphere to fully contain any possible sources of ignition within the enclosure, thus preventing propagation of an explosion.

The automation equipment could potentially be housed in an explosion-proof enclosure. Currently, explosion-proof enclosures rely on conductive heat transfer for dissipating heat produced by equipment within the enclosure. However, these enclosures do not adequately dissipate the heat produced by the automation equipment within and thus could cause a decrease in the life of the equipment or lead to an explosion within the enclosure. As a result, automation equipment is typically installed outside the boundaries of the hazardous area and long electrical cables are run to the devices within the hazardous area. Several disadvantages to this configuration exist. For example, this configuration results in lack of control at the device, as well as an increase in installation, and/or maintenance costs.

Therefore, a need exists in the art for an explosion-proof enclosure having automation and other equipment that can provide active thermal management in a hazardous area.

SUMMARY

The present invention can satisfy the above-described need by providing enclosures for use in hazardous areas and having heat exchangers. As used herein, the term "heat exchanger" refers to any device that transfers heat from one medium to another or to the environment. The heat exchangers aid in regulating the internal temperature of an enclosure by actively cooling or heating equipment housed within the enclosure.

The enclosures of the present invention include a heat exchanger device coupled thereto. In some aspects, the heat exchanger is a thermoelectric cooler, a shell and tube heat exchanger, a plate heat exchanger, or a spiral heat exchanger. The enclosures include equipment housed therein. A heat exchanger is in communication with the internal equipment and external environment, and actively transfers heat from within the enclosure to outside of the enclosure, thereby removing heat produced from the equipment within the enclosure. In certain aspects of the invention, the heat exchanger actively transfers heating from outside the enclosure to within the enclosure, thereby heating the equipment within the enclosure. In certain aspects of the invention, the heat exchanger device are controlled by a control system having a sensor and a controller.

The enclosures also can include at least one fan positioned proximate to the heat exchanger device. The fan can be positioned within the enclosure or externally mounted to the enclosure. The fan can be controlled by a control system having a sensor and a controller.

These and other aspects, objects, and features of the invention will become apparent to those having ordinary skill in the art upon consideration of the following detailed description of exemplary embodiments exemplifying the best mode for carrying out the invention as presently perceived.

DETAILED DESCRIPTION OF EXEMPLARY EMBODIMENTS

Figure 1:
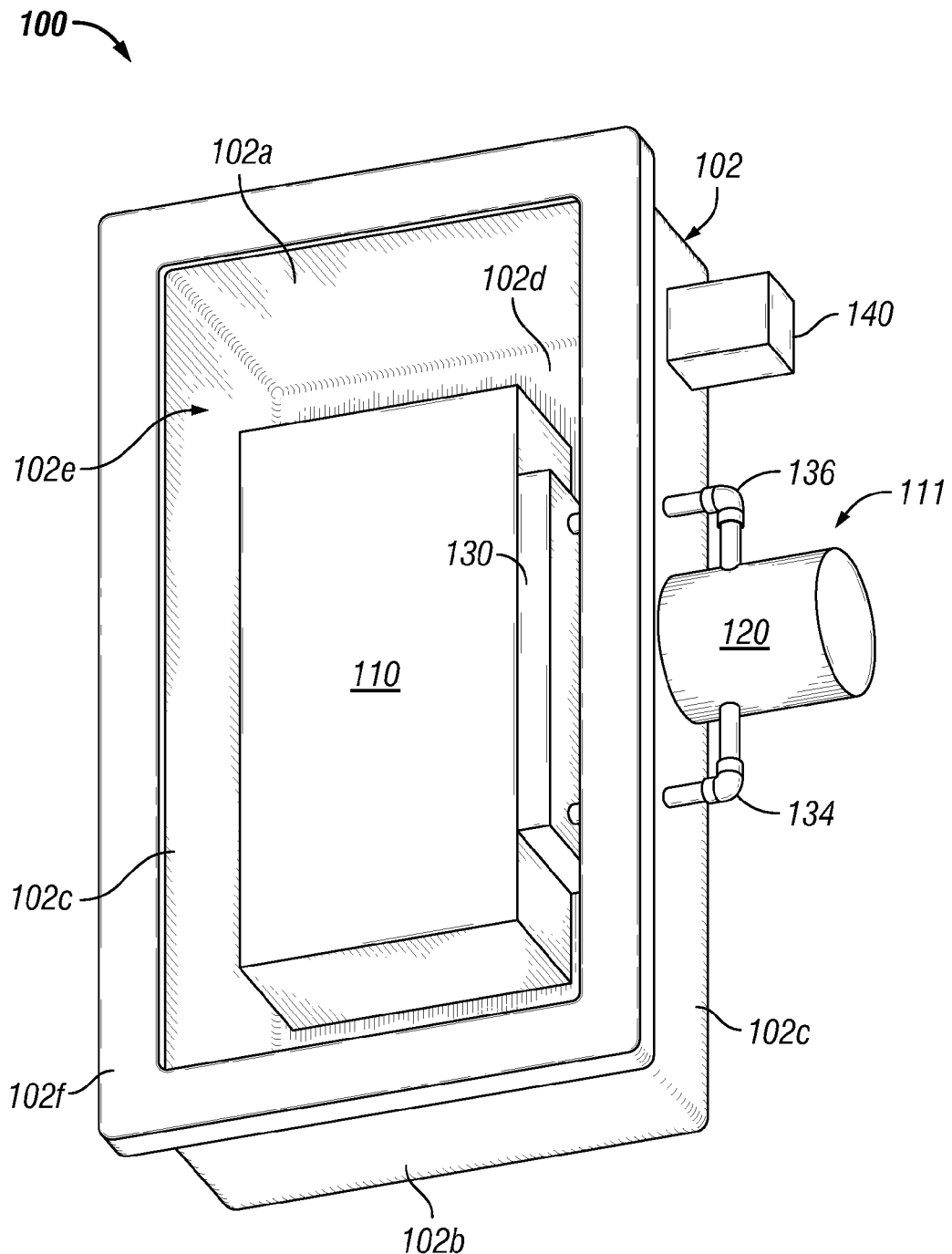
FIG. 1 is a perspective view of an explosion-proof enclosure with the cover removed according to an exemplary embodiment.

This application discloses enclosures having active thermal management capabilities. The enclosures include a heat exchanger that aids in dissipating heat from within the enclosure. The enclosures can be used for both general purposes and in hazardous areas.

The present invention may be better understood by reading the following description of non-limiting embodiments with reference to the attached drawings wherein like parts of each of the figures are identified by the same reference characters.

Figure 2:
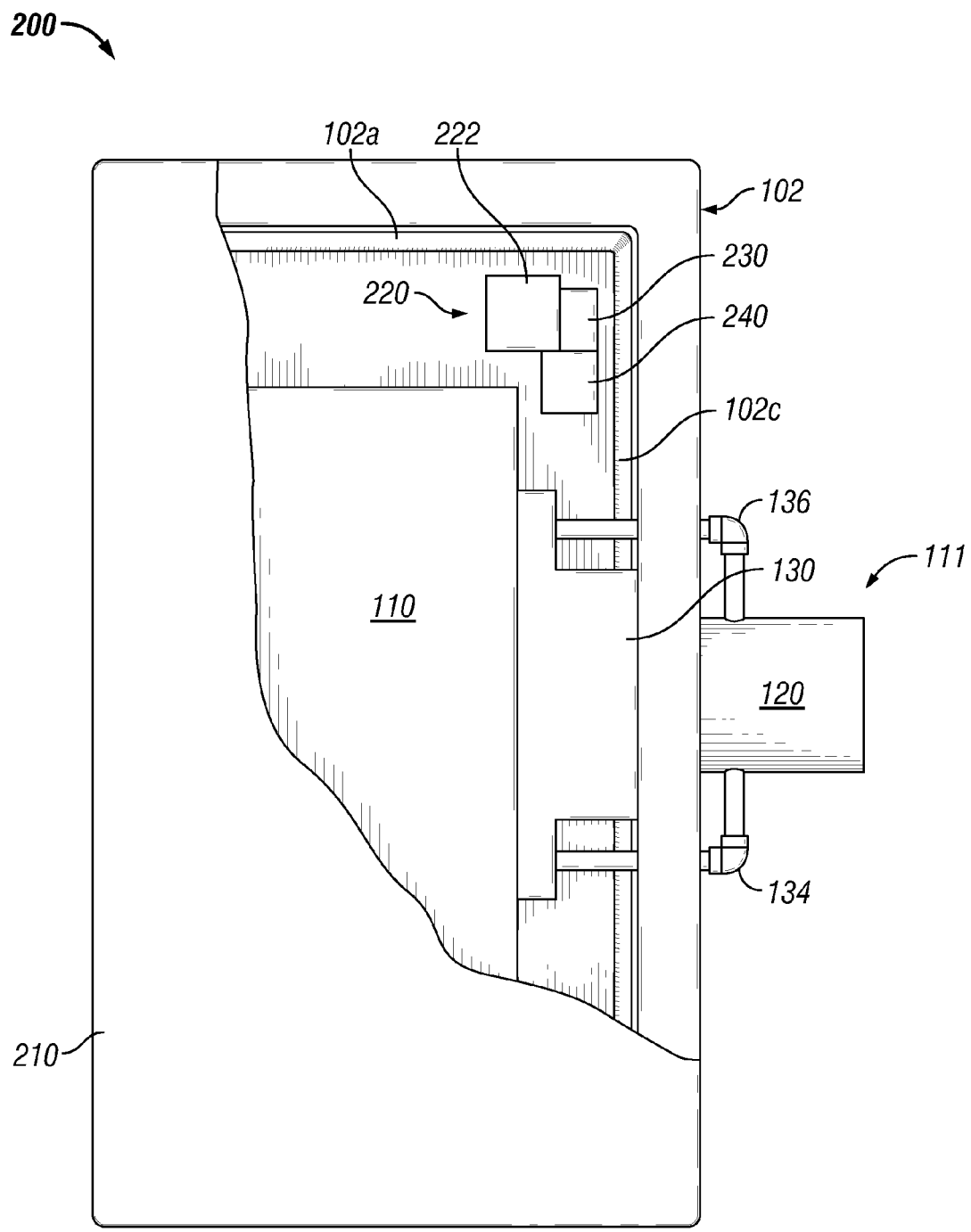
FIG. 2 is a semi-transparent frontal view of another explosion-proof enclosure according to an exemplary embodiment.

FIG. 1 shows a perspective view of an explosion-proof enclosure 100 with a cover (not shown) removed. FIG. 2 shows a semi-transparent frontal view of an explosion-proof enclosure 200 with a cover (210) coupled to the housing 102. The enclosures 100, 200 each include a rectangular housing 102. Each housing 102 includes a top wall 102a, a bottom wall 102b, two side walls 102c, a rear wall 102d, and a cavity 102e. Each housing 102 also includes a flange 102f extending orthogonally from the top, bottom, and two side walls 102a, 102b, 102c. In certain embodiments, the housing 102 is constructed from aluminum and is a NEMA 7 compliant enclosure for indoor or outdoor use in locations classified as Class I, Groups A, B, C, or D.

Each enclosure 100, 200 also includes automation equipment 110 positioned within the cavity 102e and coupled to the rear wall 102d. In alternative embodiments, the automation equipment 110 can be coupled to the top wall 102a, the bottom wall 102b, or one of the side walls 102c. The automation equipment 110 produces heat within the enclosures 100, 200 which should be dissipated to maintain a desired temperature within the enclosure 100, 200. In certain embodiments, the automation equipment 110 may include a controller, such as a variable frequency drive (VFD) that controls the frequency of electrical power supplied to an external device, such as a pump or a motor (not shown). In certain embodiments, the automation equipment 110 may also include a transformer, a programmable logic controller (PLC), and/or a line reactor.

Each enclosure 100, 200 also includes a heat exchanger system 111 that includes a heat exchanger 120 and a plate 130. The heat exchanger 120 in FIG. 2 is coupled to the exterior of the housing 102. The heat exchanger 120 may be coupled to the housing 102 by any suitable means, such as by mating threads or by bolting a flange (not shown) on the heat exchanger 120 to the housing 102. In certain alternative embodiments, as shown in FIG. 1, the heat exchanger 120 can be positioned in proximity to the housing 102 but not be attached.

The plate 130 of the heat exchanger system 111 is positioned within the cavity 102e. In certain embodiments, the plate 130 is coupled to the automation equipment 110. In certain embodiments, as shown in FIG. 2, the plate 130 also is coupled to the side wall 102c. The plate 130 is fabricated from thermally conductive material. Suitable examples of thermally conductive materials include, but are not limited to, copper, aluminum, titanium, stainless steel, other metal alloys, and thermally conductive polymers. In certain embodiments, the plate 130 may be constructed from multiple thin plates. The size and shape of the plate 130 can be configured based on the amount of heating or cooling desired. In certain embodiments, the plate 130 is constructed from copper or aluminum.

The heat exchanger 120 is in communication with the plate 130 via inlet pipe 134 and outlet pipe 136. The inlet and outlet pipes 134, 136 are coupled to the heat exchanger 120 to the plate 130 through the side wall 102c. The inlet and outlet pipes 134, 136 may be sealed within the side wall 102c so as to maintain the hazardous rating integrity of the enclosure 100. In certain embodiments, the automation equipment releases heat, which is absorbed by the plate 130. A cooled fluid flows from the heat exchanger 120 through the inlet pipe 134. The cooled fluid enters a cavity (not shown) within the plate 130 and absorbs heat from the plate 130 before exiting the enclosure 100 through outlet pipe 136 as a heated fluid. The heated fluid returns to the heat exchanger 120 where it is cooled again before returning to the plate 130 via inlet pipe 134.

In certain alternative embodiments, the enclosures 100, 200 may include equipment (not shown) that requires heating. In these instances, a heated fluid flows from the heat exchanger 120 through the inlet pipe 134. The heated fluid enters the cavity (not shown) within the plate 130 and gives off heat to the plate 130, which in turn heats the equipment within the enclosure, before exiting an enclosure 100, 200 through outlet pipe 136 as a cooled fluid. The cooled fluid returns to the heat exchanger 120 where it is heated again before returning to the plate 130 via inlet pipe 134.

The heat exchanger systems (e.g., heat exchanger system 111) of the present invention can be any device capable of heating and/or cooling equipment within an enclosure 100, 200 by heat transfer. Suitable examples of heat exchanger devices include, but are not limited to, Peltier devices or thermoelectric coolers, shell and tube heat exchangers, plate heat exchangers, and spiral heat exchangers. In certain embodiments, the heat exchanger devices are integrated into the housing 102 and a first portion of the heat exchanger device interfaces with the interior of the enclosure 100, 200 and a second portion of the heat exchanger device is positioned exterior to the enclosure 100, 200.

In certain embodiments, as shown in FIG. 2, a fan (240) may be positioned within the housing 102 and proximate to the plate 130 to facilitate heat transfer. The fan 240 can be powered by an internal power source, such as a battery (not shown), or receive power from a source (not shown) external to the enclosure 200. In certain alternative embodiments, as shown in FIG. 1, a fan (140) may be externally mounted to the housing 102 to facilitate heat transfer. One having ordinary skill in the art will recognize that any number of configurations having a fan are possible.

In certain embodiments, as shown in FIG. 2, the enclosure 200 may include a control system (220) for monitoring and controlling the heat exchanger system 111. In certain embodiments, the control system 220 monitors and controls the fan 240. The control system 220 generally includes a sensor 230 that is coupled to a controller 222 that controls the heat exchanger system 111 and/or the fan 240. The sensor 230 actively or passively monitors conditions within the enclosure 200. Based on the conditions within the enclosure 200, the controller 222 can turn on or off the heat exchanger system 111 and/or the fan 240. For example, the sensor 230 may be a temperature gauge that senses the temperature within the enclosure 200. When the sensor 230 indicates that the temperature within the enclosure 200 is too high, the controller 222 turns on the heat exchanger system 111 and/or the fan 240 inside the enclosure 200 to remove heat from within the housing 102 to an exterior of the housing 102. Similarly, when the sensor 230 indicates that the temperature within the enclosure 200 is low, the controller 222 can turn on the heat exchanger system 111 and/or the fan 240 externally mounted to the enclosure 200 to heat the air within the enclosure 200. In some embodiments, the control system 220 cycles on and off passively. For example, the control system 220 can cycle such that the heat exchanger system 111 and/or the fan 240 is active for ten minutes every thirty minutes. In certain embodiments, the control system 220 includes a sensor 230 capable of detecting humidity changes within the enclosure 200. If the sensor 230 detects that the relative humidity within the enclosure 200 is too high, the control system 220 can turn on the fan 240 inside the enclosure 200. In certain other embodiments, the control system 220 includes a sensor 230 capable of determining whether an explosion has occurred by detecting a rapid temperature or pressure change. Upon detection of an internal explosion, the sensor 230 communicates the state change to the controller 222, which communicates the state change to a local indicator (not shown) or wirelessly to a remote location. One having ordinary skill in the art will recognize that the control system 220 can be programmed any number of ways to meet specifications of a given area and include any number or type of sensors (e.g., sensor 230) to determine various states within the enclosure 200. In certain embodiments, the control system 220 is controlled wirelessly by a user in a remote location.

Therefore, the present invention is well adapted to attain the ends and advantages mentioned as well as those that are inherent therein. The particular embodiments disclosed above are illustrative only, as the present invention may be modified and practiced in different but equivalent manners apparent to a person having ordinary skill in the art and the benefit of the teachings herein. Having described some exemplary embodiments of the present invention, the use of alternative configurations having heat exchangers in communication with an enclosure is within the purview of those in the art. For example, the heat exchanger system can be positioned on any wall of the enclosure or a portion may be external to the enclosure. Additionally, while the present application discusses a single heat exchanger external to the enclosure, it is understood that a number of other heat exchangers may be used based on the heat transfer properties desired and using the teachings described herein. In addition, the exemplary embodiments of the present invention may be used to actively displace cold air from within the enclosures to the atmosphere. While numerous changes may be made by one having ordinary skill in the art, such changes are encompassed within the scope and spirit of this invention as defined by the appended claims. Furthermore, the details of construction or design herein shown do not limit the invention, other than as described in the claims below. It is therefore evident that the particular exemplary embodiments disclosed above may be altered or modified and all such variations are considered within the scope and spirit of the present invention. The terms in the claims have their plain, ordinary meaning unless otherwise explicitly and clearly defined by the patentee.

What is claimed is:

1. An explosion-proof enclosure system, comprising:
    an explosion-proof housing designed to contain an internal explosion without causing an external hazard; and
    a heat exchanger system comprising:
        a first portion positioned inside of the explosion-proof housing; and
        a second portion mechanically coupled to the first portion, wherein the second portion is positioned outside of the explosion-proof housing.

2. The system of claim 1, further comprising:
    an inlet pipe mechanically coupled to the first portion and the second portion, wherein the inlet pipe transports a cooled fluid from the second portion to the first portion; and
    an outlet pipe mechanically coupled to the first portion and the second portion, wherein the outlet pipe transports a heated fluid from the first portion to the second portion.

3. The system of claim 2, wherein the inlet pipe and the outlet pipe each traverse a wall of the explosion-proof housing.

4. The system of claim 3, wherein the inlet pipe and the outlet pipe are each sealed within the wall to maintain a desired hazardous rating integrity of the explosion-proof housing.

5. The system of claim 1, wherein the first portion is integrated into a wall of the explosion-proof housing.

6. The system of claim 1, wherein the second portion is mechanically coupled to an exterior of the explosion-proof housing.

7. The system of claim 1, further comprising equipment positioned inside of the explosion-proof housing, the equipment to be cooled or heated by the heat exchanger system.

8. The system of claim 1, wherein the explosion-proof housing is sealed to contain sources of ignition within the explosion-proof housing.

9. The system of claim 1, further comprising:
    a sensor that monitors a condition within the explosion-proof housing.

* * * * *